United States Patent
Uchikawa et al.

(10) Patent No.: US 9,984,752 B2
(45) Date of Patent: May 29, 2018

(54) MEMORY SYSTEM AND DATA ENCODING AND DECODING METHOD TO MITIGATE INTER-CELL INTERFERENCE

(71) Applicant: Toshiba Memory Corporation, Minato-ku (JP)

(72) Inventors: Hironori Uchikawa, Fujisawa (JP); Kenji Sakurada, Yamato (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days. days.

(21) Appl. No.: 15/257,336

(22) Filed: Sep. 6, 2016

(65) Prior Publication Data
US 2017/0262334 A1 Sep. 14, 2017

Related U.S. Application Data

(60) Provisional application No. 62/307,738, filed on Mar. 14, 2016.

(51) Int. Cl.
*G11C 16/04* (2006.01)
*G11C 16/10* (2006.01)
(Continued)

(52) U.S. Cl.
CPC .............. *G11C 16/04* (2013.01); *G06F 3/064* (2013.01); *G06F 11/1012* (2013.01);
(Continued)

(58) Field of Classification Search
CPC ..... G11C 16/10; G11C 16/26; G11C 11/5628; G11C 16/16; G11C 29/52; G11C 11/5642;
(Continued)

(56) References Cited

U.S. PATENT DOCUMENTS 8,149,623 B2 4/2012 Uchikawa et al.
9,086,984 B2 7/2015 Hakim et al.
(Continued)

FOREIGN PATENT DOCUMENTS

JP 2010-165426 7/2010
JP 5361603 12/2013
JP 2014-150528 8/2014

OTHER PUBLICATIONS

Veeresh Taranalli et al. "Error Analysis and Inter-Cell Interference Mitigation in Multi-Level Cell Flash Memories" IEEE International Conference on Communications (ICC), Jun. 2015, pp. 6.

*Primary Examiner* — Ajay Ojha
(74) *Attorney, Agent, or Firm* — Oblon, McClelland, Maier & Neustadt, L.L.P.

(57) ABSTRACT

A memory system and method is provided. The memory system includes a non-volatile memory, a memory interface, and a code processor. The code processor generates a likelihood value for a first read bit, which is read from a first memory cell, from among read bits contained in a codeword read by the memory interface from the non-volatile memory. For example, the likelihood value can be based on the value of the first read bit and on the value of a second read bit read from a second memory cell adjacent to the first memory cell so as to decode the codeword using the generated likelihood value.

20 Claims, 10 Drawing Sheets

(51) Int. Cl.
*G11C 11/56* (2006.01)
*G11C 16/16* (2006.01)
*G06F 3/06* (2006.01)
*G06F 11/10* (2006.01)
*G11C 16/26* (2006.01)
*G11C 29/52* (2006.01)

(52) U.S. Cl.
CPC .......... *G11C 11/5628* (2013.01); *G11C 16/10* (2013.01); *G11C 16/16* (2013.01); *G11C 11/5642* (2013.01); *G11C 16/26* (2013.01); *G11C 29/52* (2013.01)

(58) Field of Classification Search
CPC .... G06F 11/1068; G06F 3/064; G06F 3/0619; G06F 3/0679
See application file for complete search history.

(56) References Cited

U.S. PATENT DOCUMENTS

| | | | |
|---|---|---|---|
| 2011/0305082 A1* | 12/2011 | Haratsch | G11C 7/02 365/185.03 |
| 2013/0091400 A1* | 4/2013 | Xia | H03M 13/1102 714/755 |
| 2013/0176779 A1* | 7/2013 | Chen | G11C 11/5642 365/185.03 |
| 2014/0068365 A1* | 3/2014 | Chen | G06F 11/106 714/746 |
| 2014/0281800 A1 | 9/2014 | Micheloni et al. | |
| 2016/0378596 A1* | 12/2016 | Kim | H03M 13/293 714/755 |
| 2017/0046220 A1* | 2/2017 | Sharon | G06F 3/0619 |

* cited by examiner

| i-1 | i | i+1 | LLR |     |
|-----|---|-----|-----|-----|
| 0   | 0 | 0   | +1  | 201 |
| 0   | 0 | 1   | +2  |     |
| 1   | 0 | 0   | +2  |     |
| 1   | 0 | 1   | +4  |     |
| 0   | 1 | 0   | -1  |     |
| 0   | 1 | 1   | -2  |     |
| 1   | 1 | 0   | -2  |     |
| 1   | 1 | 1   | -4  |     |
| -   | i=1 | i=2 | LLR | 202 |
| -   | 0 | 0   | +1  |     |
| -   | 0 | 1   | +2  |     |
| -   | 1 | 0   | -1  |     |
| -   | 1 | 1   | -2  |     |
| B-1 | B | -   | LLR | 203 |
| 0   | 0 | -   | +1  |     |
| 1   | 0 | -   | +2  |     |
| 0   | 1 | -   | -1  |     |
| 1   | 1 | -   | -2  |     |

210

| HARD BIT | | | SOFT BIT | | | LLR |
|---|---|---|---|---|---|---|
| i-1 | i | i+1 | i-1 | i | i+1 | |
| 0 | 0 | 0 | 0 | 0 | 0 | +1 |
| 0 | 0 | 0 | 0 | 0 | 1 | +2 |
| ⋮ | ⋮ | ⋮ | ⋮ | ⋮ | ⋮ | ⋮ |
| 1 | 1 | 1 | 1 | 1 | 1 | -4 |

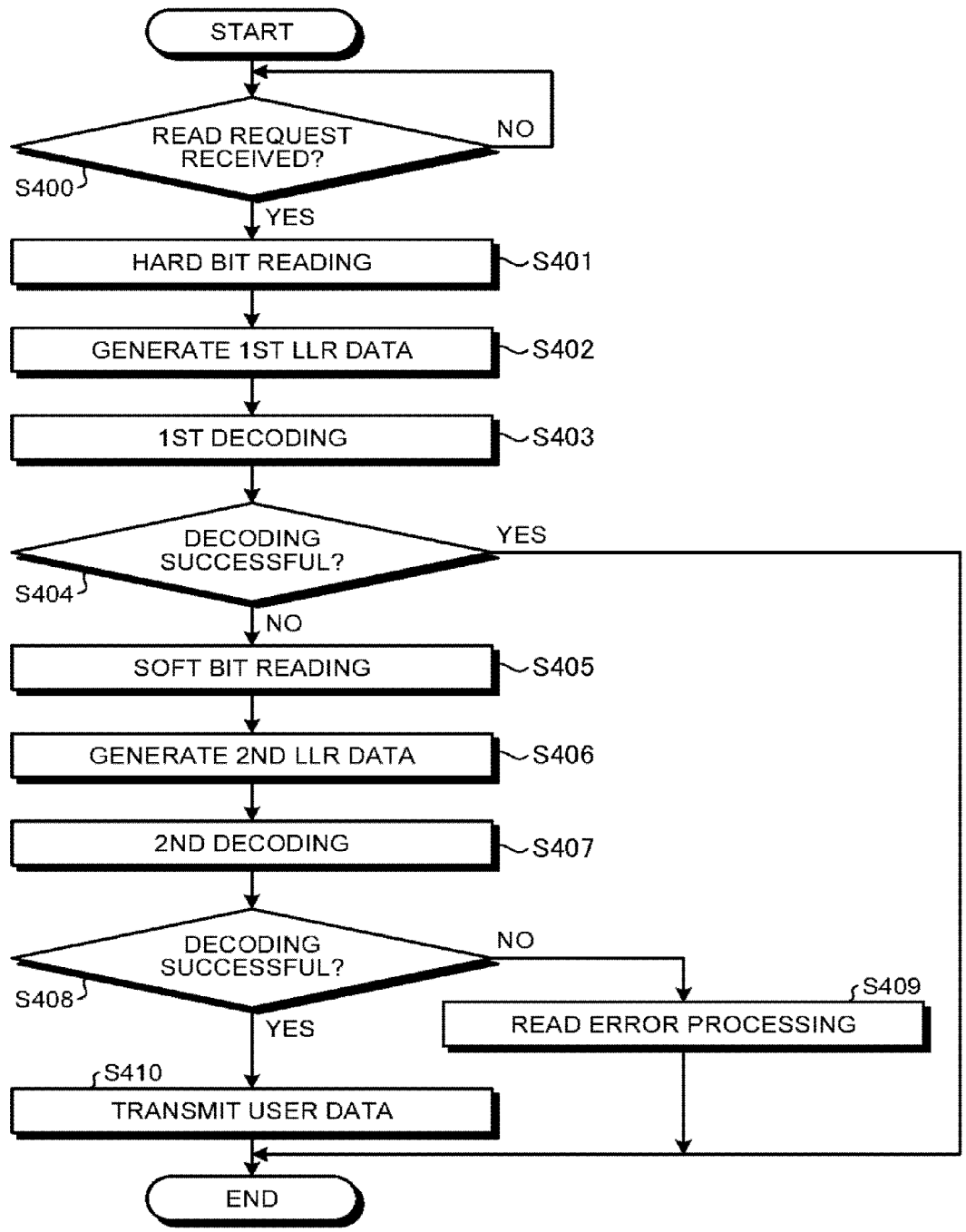

MEMORY SYSTEM AND DATA ENCODING AND DECODING METHOD TO MITIGATE INTER-CELL INTERFERENCE

CROSS-REFERENCE TO RELATED APPLICATIONS

This application is based upon and claims the benefit of priority from U.S. Provisional Application No. 62/307,738, filed on Mar. 14, 2016; the entire contents of which are incorporated herein by reference.

FIELD

Embodiments described herein relate generally to a memory system and a control method.

BACKGROUND

As one of non-volatile semiconductor memories, there is known a NAND cell type flash memory. This NAND cell type flash memory has a memory cell array formed of multiple NAND cell units. Each NAND cell unit is formed of multiple memory cell connected in series and two selection transistors connected to opposite ends of the series. The threshold voltage level of the erased state of the memory cell represents data "1". At data write time, electrons are injected into its floating gate, so that its threshold voltage level is set to a value representing data "0". As to the NAND cell type flash memory, at write time, only moving the threshold voltage from low to high is possible, and the opposite movement (moving the threshold voltage from high to low) can be performed by erase operation in a block unit.

BRIEF DESCRIPTION OF THE DRAWINGS

FIG. 13 is a flow chart showing a schematic example of the operation of a memory system at read time according to the fourth embodiment.

DETAILED DESCRIPTION

Figure 1:
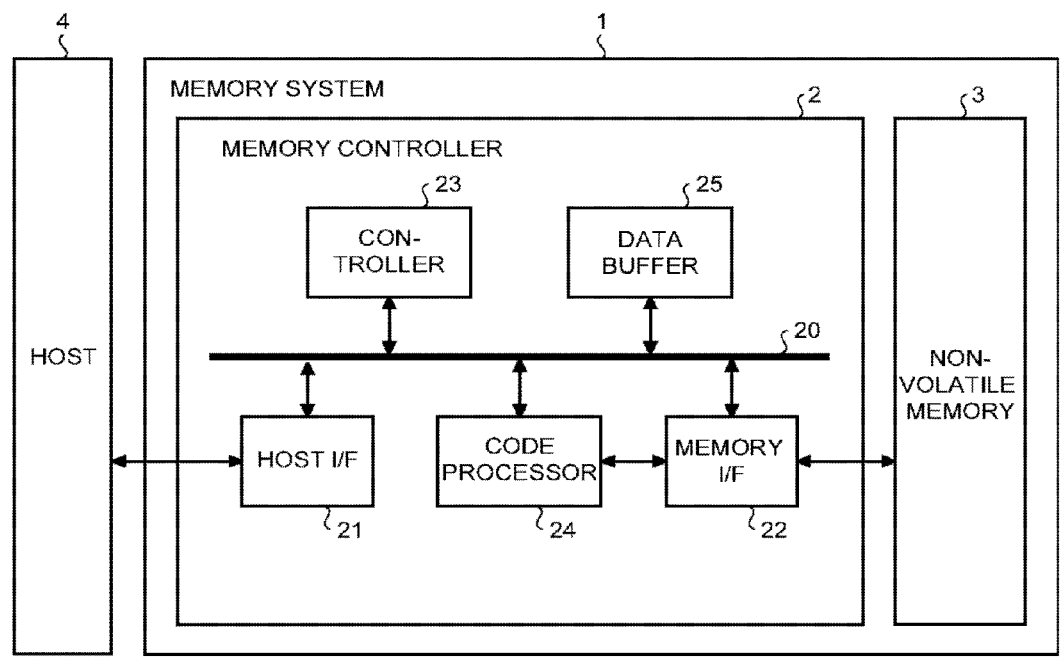
FIG. 1 is a block diagram showing a schematic example of the configuration of a memory system according to a first embodiment.

According to one embodiment, a memory system comprises a non-volatile memory that has multiple bit lines and multiple word lines and multiple memory cells provided at intersections of the bit lines and the word lines; a memory interface that performs writing/reading data into/from the non-volatile memory; and a code processor that performs encoding data to be written into the non-volatile memory and decoding data read from the non-volatile memory. The memory interface writes a codeword generated through encoding by the code processor into the non-volatile memory and reads the codeword from the non-volatile memory to input to the code processor. The code processor generates a first likelihood value for a first read bit, read from a first memory cell of the non-volatile memory, from among read bits contained in the codeword read by the memory interface from the non-volatile memory based on the value of the first read bit and on the value of a second read bit read from a second memory cell adjacent to the first memory cell so as to decode the codeword using the generated first likelihood value.

The memory systems and control methods according to embodiments will be described in detail below with reference to the accompanying drawings. The present invention is not limited to these embodiments.

In general, as to the NAND cell type flash memory, data errors occur at read time because an element device such as the oxide film forming part of a memory cell (also simply called a cell) degrades over time. Accordingly, an error correcting code is usually used to improve the reliability of the NAND cell type flash memory.

The correction processing (hereinafter called decoding) for the error correcting code is divided mainly into two processes according to information used in decoding. In this description, one of them is referred to as hard determination decoding, and the other is referred to as soft determination decoding. In the hard determination decoding, input data to the decoder is binary data, whereas, in soft determination decoding, likelihood values representing the ratios of likelihood that a bit is 0 to likelihood that the bit is 1 are input to the decoder.

The logarithm likelihood ratio expressed by the following equation (1) is generally used as the likelihood value. In the equation (1), $x_i$ denotes an ith write bit, and $y_i$ denotes an ith read bit. $L_i$ is the logarithm likelihood ratio for the ith bit. $P(x|y)$ denotes a conditional probability and is a value which can be calculated from, e.g., the threshold voltage distribution and error rate of the NAND cell type flash memory.

$$L_i = \log \frac{p(x_i = 0 \mid y_i)}{p(x_i = 1 \mid y_i)} \qquad (1)$$

Meanwhile, in these years, memory cells are being made finer in order to make the NAND cell type flash memory larger in capacity. However, making memory cells finer results in distances between adjacent memory cells being smaller, and thus there is the problem that the influence of a proximity effect between memory cells, so-called inter-cell interference, becomes larger. Because the threshold voltages of memory cells change under the influence of inter-cell interference, the error rate of read data tends to increase. Further, because the amount of change in threshold voltage due to the inter-cell interference is affected by the threshold voltage levels of the adjacent memory cells, there is also the possibility that the error rate may further increase depending on the pattern of write values.

As such, the error rate of memory cells depends on the threshold voltage levels of the adjacent memory cells, but in the conventional calculating formula for the likelihood value expressed by the equation (1), the influence of adjacent memory cells is not taken into account. Accordingly, in embodiments below, several examples of the memory system and control method which can generate highly accurate likelihood values using the values of the threshold voltage levels of adjacent memory cells will be described. With memory systems and control methods illustrated in embodiments below, highly accurate likelihood values are obtained, and thus it is possible to improve the capability of correcting errors by soft determination decoding. Therefore, it is possible to realize highly reliable memory systems and control methods.

First Embodiment

FIG. 1 is a block diagram showing a schematic example of the configuration of a memory system according to the first embodiment. The memory system 1 according to the first embodiment comprises a memory controller 2 and a non-volatile memory 3. The memory system 1 can be connected to a host 4, and FIG. 1 shows the state where it is connected to the host 4. The host 4 may be an electronic device such as a personal computer or a mobile terminal.

The non-volatile memory 3 is one which stores data in a non-volatile manner and is, for example, a NAND cell type flash memory. Although an example where the NAND cell type flash memory is used as the non-volatile memory 3 is described herein, a memory other than the NAND cell type flash memory may be used. Writing (programming) into and reading from the non-volatile memory 3 are performed in data units called pages. Erasing in the non-volatile memory 3 is performed in block units each consisting of multiple pages. The non-volatile memory 3 has multiple word lines and multiple bit lines.

In this description, memory cells connected in common to one word line are defined as a memory cell group. Where the memory cells are single-level cells (SLCs), the memory cell group corresponds to one page. Where the memory cells are multi-level cells (MLCs), the memory cell group corresponds to multiple pages. For example, where multi-level cells capable of two-bit storage (two bits per cell) are used, the memory cell group corresponds to two pages. Where triple-level cells (TLCs) capable of three-bit storage (three bits per cell) are used, the memory cell group corresponds to three pages.

The memory controller 2 controls writing into the non-volatile memory 3 according to a write request from the host 4. Also, the memory controller 2 controls reading from the non-volatile memory 3 according to a read request from the host 4. The memory controller 2 comprises a host interface (I/F) 21, a memory interface (I/F) 22 (a memory control unit), a controller 23, a code processor 24, and a data buffer 25. The host interface (I/F) 21, memory interface (I/F) 22 (memory control unit), controller 23, code processor 24, and data buffer 25 are connected to each other via an internal bus 20.

The host I/F 21 outputs commands, user data (write data), and the like received from the host 4 onto the internal bus 20. Further, the host I/F 21 transmits user data read from the non-volatile memory 3, responses from the controller 23, and the like to the host 4.

The memory I/F 22 controls the process of writing user data or the like into the non-volatile memory 3 and the process of reading from the non-volatile memory 3 according to instructions from the controller 23.

The code processor 24 comprises an encoding circuit 101 and a decoding circuit 105. The encoding circuit 101 encodes user data to generate codewords. In the first embodiment, data of a predetermined data size forming codewords is referred to as an ECC (Error Correcting Codes) frame. One ECC frame of data is stored in one page or multiple pages of the non-volatile memory 3. The decoding circuit 105 decodes codewords. LPDC (low density parity check) coding can be used as the coding scheme used by the code processor 24. The coding scheme is not limited to this. As long as they are schemes in which the decoding circuit 105 can perform decoding using likelihood information as with the LPDC code, various coding schemes can be applied to the code processor 24.

The controller 23 controls the memory system 1 overall. The controller 23 is, for example, a CPU (central processing unit), an MPU (micro-processing t or the like. When receiving a command from the host 4 via the host I/F 21, the controller 23 performs control according to the command. For example, when receiving a write request from the host 4, the controller 23 instructs the encoding circuit 101 to encode user data to be written. Further, the controller 23 instructs the memory I/F 22 to write codewords generated by the encoding circuit 101 into the non-volatile memory 3. And when receiving a read request from the host 4, the controller 23 instructs the memory I/F 22 to read codewords from the non-volatile memory 3. Further, the controller 23 instructs the decoding circuit 105 to decode the codewords read from the non-volatile memory 3. The controller 23 manages write destinations for codewords on the non-volatile memory 3 (physical addresses on the non-volatile memory 3).

The data buffer 25 temporarily stores user data received from the host 4 until it is stored into the non-volatile memory 3 and temporarily stores data read from the non-volatile memory 3 until it is transmitted to the host 4. The data buffer 25 is constituted by, e.g., a general-purpose memory such as an SRAM (static random access memory) or a DRAM (dynamic random access memory).

Although FIG. 1 illustrates a configuration where the memory controller 2 comprises the code processor 24 and the memory I/F 22, the system is not limited to this configuration. For example, the code processor 24 may be integrated in the memory I/F 22.

Figure 2:
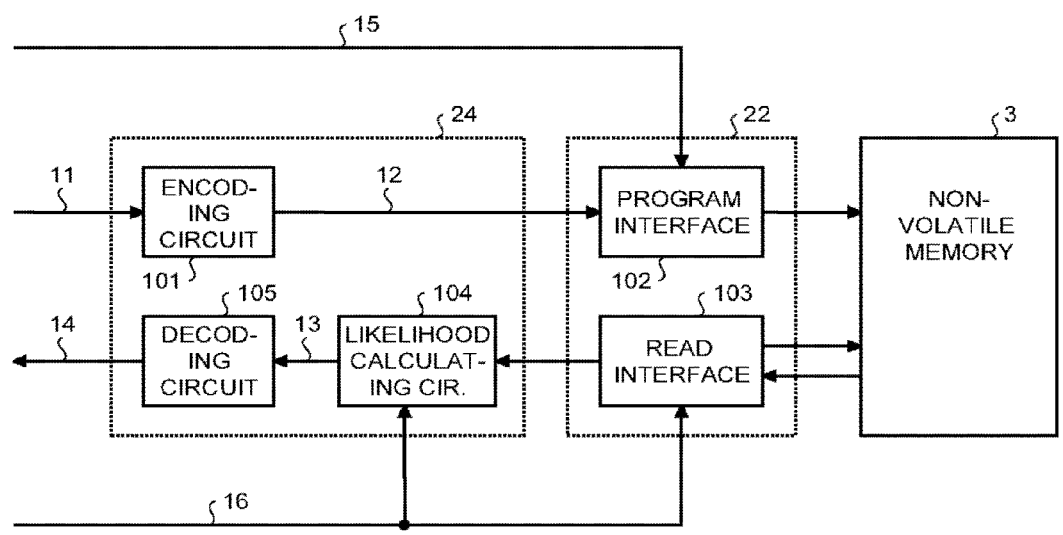
FIG. 2 is a block diagram for explaining example operation of from encoding to decoding according to the first embodiment.

Next, example operation of from encoding to decoding according to the first embodiment will be described in detail with reference to the drawings. FIG. 2 is a block diagram for explaining example operation of from encoding to decoding according to the first embodiment, and is one which shows a more detailed-example configuration of the code processor 24, the memory I/F 22, and the non-volatile memory 3 in the memory system 1 shown in FIG. 1. As shown in FIG. 2, the code processor 24 includes an encoding circuit 101, a likelihood calculating circuit 104, and a decoding circuit 105. The memory I/F 22 includes a program interface 102 and a read interface 103.

User data 11 to be written is input to the encoding circuit 101 via the internal bus 20. User data 11 is received together with a write request from the host 4 by, e.g., the host I/F 21 and is temporarily stored in the data buffer 25. The encoding circuit 101 adds parity data according to a predetermined error correcting code (e.g., an LDPC code) to the user data 11 to generate ECC data 12. The encoding circuit 101 inputs the ECC data 12 to the program interface 102.

The program interface 102 performs program processing to write the ECC data 12 into the non-volatile memory 3 at the specified addresses based on an address 15 inputted from, e.g., the controller 23.

Each memory cell in the non-volatile memory 3 holds a write threshold voltage level that is set according to a program processing instruction from the program interface 102. Further, the non-volatile memory 3 compares a specified determination threshold voltage level and the actual threshold voltage level held by each memory cell according to a read processing instruction inputted from the read interface 103 so as to return read data consisting of the comparing results (Os and is or Highs or Lows).

The read interface 103 inputs the above read processing instruction to the non-volatile memory 3 based on an address 16 inputted from, e.g., the controller 23. The read interface 103 outputs read data received from the non-volatile memory 3 to the likelihood calculating circuit 104 according to the read processing instruction.

The likelihood calculating circuit 104 calculates logarithm likelihood ratio (LLR) data 13 representing the likelihood of the bit stored in each memory cell based on the address 16 inputted from the controller 23 and the read data inputted from the read interface 103, for example. The likelihood calculating circuit 104 outputs the LLR data 13 to the decoding circuit 105.

The likelihood calculating circuit 104 calculates the logarithm likelihood ratio $L_i$ for the ith bit using the following equation (2). In the equation (2), $x_i$ denotes the ith write bit, and $y_{i-1}$, $y_i$, and $y_{i+1}$ denote the (i−1)'th, ith, and (i+1)'th read bits respectively.

$$L_i = \log \frac{p(x_i = 0 \mid y_{i-1}, y_i, y_{i+1})}{p(x_i = 1 \mid y_{i-1}, y_i, y_{i+1})} \quad (2)$$

The decoding circuit 105 performs error correction processing according to a soft determination decoding algorithm on the LLR data 13 on an ECC frame basis to reconstruct user data 14 that is subject to reading. The reconstructed user data 14 is, for example, inputted to the controller 23 and transmitted to the host 4 via the host I/F 21.

Figure 3:
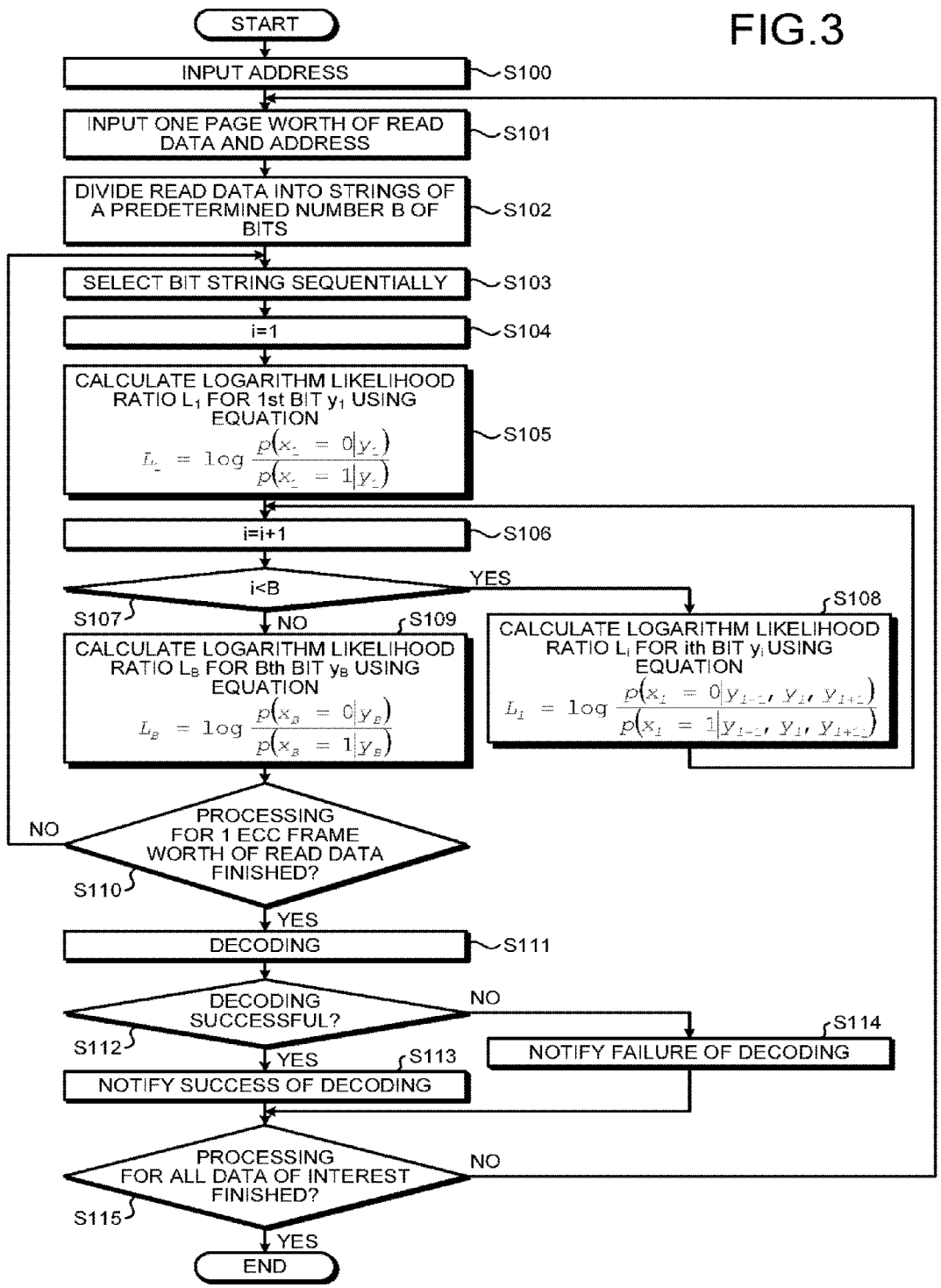
FIG. 3 is a flow chart showing a schematic example of the operation of the memory system according to the first embodiment.

Next, the operation of the memory system 1 according to the first embodiment will be described in detail with reference to the drawings. FIG. 3 is a flow chart showing a schematic example of the operation of the memory system according to the first embodiment. In FIG. 3 and the description below, the operations of the components of the code processor 24 shown in FIGS. 1 and 2 are focused on.

The operation shown in FIG. 3 is performed, for example, when the controller 23 instructs the memory I/F 22 to read data from the non-volatile memory 3 (a read processing instruction) and also instructs the code processor 24 to decode read data.

As shown in FIG. 3, in this operation, first, an address 16 on the non-volatile memory 3 at which data to be read is stored is inputted to the likelihood calculating circuit 104 (step S100). The address 16 is inputted from, e.g., the controller 23. Then one page worth of read data read by the read interface 103 is inputted to the likelihood calculating circuit 104 (step S101). Then the likelihood calculating circuit 104 divides the one page worth of inputted read data into bit strings each formed of a predetermined number B of bits (step S102). As the predetermined number B, various bit numbers such as the number of bits contained in one page worth of data or the number of bits contained in an operation unit in decoding can be used.

Then the likelihood calculating circuit 104 selects one sequentially from the bit strings obtained by the division (step S103) and sets the value i of an up-counter (not shown) to 1 (i=1) (step S104). Then the likelihood calculating circuit 104 calculates the logarithm likelihood ratio (LLR data 13) for the ith read bit in the selected bit string, that is, the first read bit based on the aforementioned equation (1) (step S105). The calculated LLR data 13 is inputted to the decoding circuit 105.

Then the likelihood calculating circuit 104 increments the value i of the up-counter by 1 (step S106) and determines whether the value i after increment is less than the predetermined number B (step S107).

If the value i is less than the predetermined number B, that is, if the value i of the up-counter has not reached the predetermined number B (YES at step S107), the likelihood calculating circuit 104 calculates LLR data 13 for the ith read bit using the (i−1)'th, ith, and (i+1)'th read bits and the aforementioned equation (2) (step S108). The calculated LLR data 13 is inputted to the decoding circuit 105. Then the likelihood calculating circuit 104 makes the process return to step S106 to perform subsequent operation so as to calculate LLR data 13 for the second to (B−1)'th read bits and to input the calculated LLR data 13 sequentially to the decoding circuit 105.

On the other hand, if the value i has reached the predetermined number B (NO at step S107), the likelihood calculating circuit 104 calculates LLR data 13 for the Bth read bit based on the aforementioned equation (1) (step S109). The calculated LLR data 13 is inputted to the decoding circuit 105.

After, in this way, calculating LLR data 13 for the first to Bth read bit and inputting to the decoding circuit 105, the likelihood calculating circuit 104 determines whether the process of calculating the logarithm likelihood ratios for one ECC frame worth of read data inputted at step S101 has finished (step S110), and if not finished (NO at step S110), the process returns to step S103 to repeat the process of calculating the logarithm likelihood ratios for subsequent bit strings sequentially so as to generate LLR data 13 for the one ECC frame worth of read data.

On the other hand, if the process of calculating the logarithm likelihood ratios for one ECC frame worth of read data has finished (YES at step S110), the decoding circuit 105, to which the LLR data 13 generated by this is inputted, performs error correction processing according to the soft determination decoding algorithm on the inputted LLR data 13 on an ECC frame basis so as to reconstruct user data 14 that is subject to reading (step S111). The reconstructing result is temporarily stored in, e.g., the data buffer 25.

Next, the decoding circuit 105 determines whether decoding at step S111 was successful (step S112) and, if successful (YES at step S112), notifies the controller 23 that the decoding was successful (step S113), and the process proceeds to step S115. In response to this, the controller 23 may transmit user data 14 successfully decoded into and currently stored in, e.g., the data buffer 25 to the host 4 via the host I/F 21 or wait until all user data 14 that is subject to reading is stored in the data buffer 25. On the other hand, if the decoding failed (NO at step S112), the decoding circuit 105 notifies the controller 23 that the decoding failed (step S114), and the process proceeds to step S115. In response to this, the controller 23 notifies the host 4 via the host I/F 21 that it failed to read data of interest.

Then the likelihood calculating circuit 104 determines whether the process of decoding all data subject to reading has finished based on the address 16 inputted at step S101 (step S115) and, if not finished (NO at step S115), the process returns to step S101 to repeat the process of calculating the logarithm likelihood ratios for the next one ECC frame worth of read data so as to generate LLR data 13 for all data subject to reading. On the other hand, if the process of calculating the logarithm likelihood ratios for all data subject to reading has finished (YES at step S111), the decoding circuit 105 finishes this operation.

As described above, the memory system 1 according to the first embodiment calculates likelihood values (LLR data 13) taking into account values read from adjacent memory cells. Thus, it is possible to highly accurately calculate likelihood values to be inputted to the decoding circuit 105, so that decoding errors can be reduced in number. As a result, it is possible to improve the reliability of the memory system 1 in reading.

Although in the first embodiment a likelihood value (LLR data 13) for a bit of interest (the ith bit) is calculated using a total of three bits that are the bit of interest (the ith bit) and bits before and after, and adjacent to, this (the (i−1)'th bit and (i+1)'th bit), the invention is not limited to this. That is, a likelihood value (LLR data 13) for a bit of interest may be calculated using a total of (m+n+1) bits that are the bit of interest, m bits immediately before the bit of interest, where m is two or greater, and n bits immediately after, where n is two or greater. The m and n need not be the same.

Although the first embodiment illustrates the case where a likelihood value (LLR data 13) is calculated using multiple bits read from memory cells connected to the same word line, the invention is not limited to this. For example, a likelihood value (LLR data 13) may be calculated using bits read from adjacent memory cells respectively connected to adjacent word lines.

Second Embodiment

Next, the memory system and control method according to the second embodiment will be described in detail below with reference to the drawings. In the description below, the same reference numerals are used to denote the same components and operations as in the above embodiment, and duplicate description thereof is omitted.

Although in the first embodiment the system is configured such that the likelihood calculating circuit 104 calculates a likelihood value (LLR data 13) for each read bit using the equation (1) or (2), the invention is not limited to this configuration. For example, a look-up table in which likelihood values (LLR data 13) are associated with bit strings formed of a bit of interest (the ith read bit), m bits immediately before the bit of interest and n bits immediately after (hereinafter called an LLR table), can be created beforehand, and the system can be configured such that a likelihood value (LLR data 13) for the ith bit is obtained using this LLR table.

Figures 4, 5:
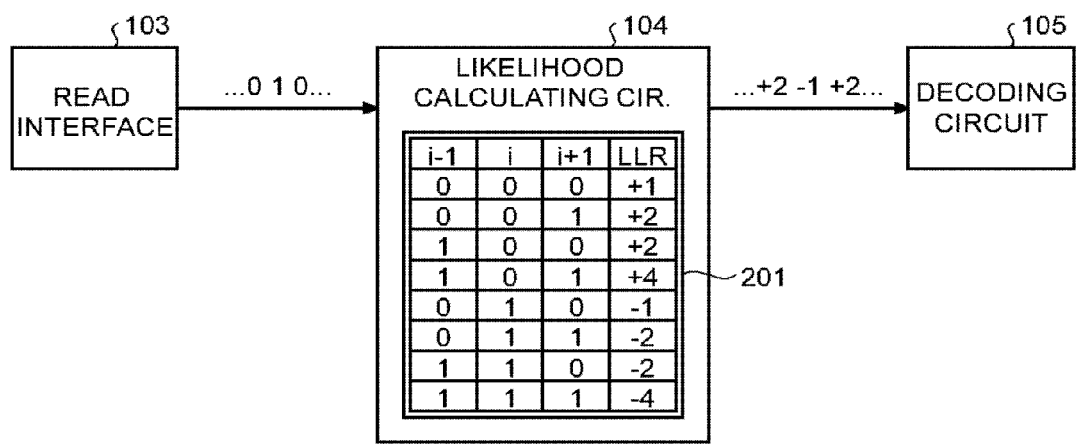
FIG. 4 is a schematic diagram showing a schematic example of the configuration of a likelihood calculating circuit comprising an LLR table according to a second embodiment.
FIG. 5 shows another example of the LLR table according to the second embodiment.

FIG. 4 is a schematic diagram showing a schematic example of the configuration of a likelihood calculating circuit comprising the LLR table according to the second embodiment. FIG. 4 illustrates the case where a bit string formed of a total of three read bits that are the bit of interest (the ith read bit) and read bits before and after, and adjacent to, this (i.e., the (i−1)'th and (i+1)'th read bits) is associated with LLR data 13. Because the configuration of the other parts of the memory system according to the second embodiment may be the same as the configuration of those described using FIGS. 1 and 2, detailed description thereof is omitted from below.

As shown in FIG. 4, the LLR table 201 has a data structure where each of sequences (bit strings) of the values (0 or 1) of three bits, for example, the (i−1)'th to (i+1)'th bits, is associated with LLR data (LLR). If the bit string is a sequence of the values (0 or 1) of three bits, the number of entries in the LLR table 201 is $2^3$, that is, 8.

If read data inputted from the read interface 103 is divided into bit strings each formed of the predetermined number B of bits, entries for the leading and last read bits (also called boundary bits) of each bit string may be added. FIG. 5 shows one example of the LLR table having entries for the leading and last read bits added, which is another example of the LLR table according to the second embodiment. In the example shown in FIG. 5, the total number of entries of the entire LLR table 210 is 16 because there are added an LLR table 202 having four entries for the leading read bit and an LLR table 203 having four entries for the last read bit.

Or in the second embodiment, for example, a different LLR table may be prepared for each address 16 inputted from the controller 23. In other words, in the second embodiment, a different LLR table may be prepared for each page. Or in the second embodiment, a different LLR table may be prepared for each bit. As such, by configuring the system such that a different LLR table is used for each address 16 (each page) or for each bit, the difference in how an error occurs between addresses 16 (pages) or bits can be dealt with, so that it is possible to further improve the reliability of the memory system 1 in reading.

When read bits are sequentially inputted from the read interface 103 of the memory I/F 22 thereto, the likelihood calculating circuit 104 identifies LLR data associated with the inputted read bit sequence (bit string) in the LLR table 201 and outputs the identified LLR data as LLR data 13 for bits of interest to the decoding circuit 105.

Figure 6:
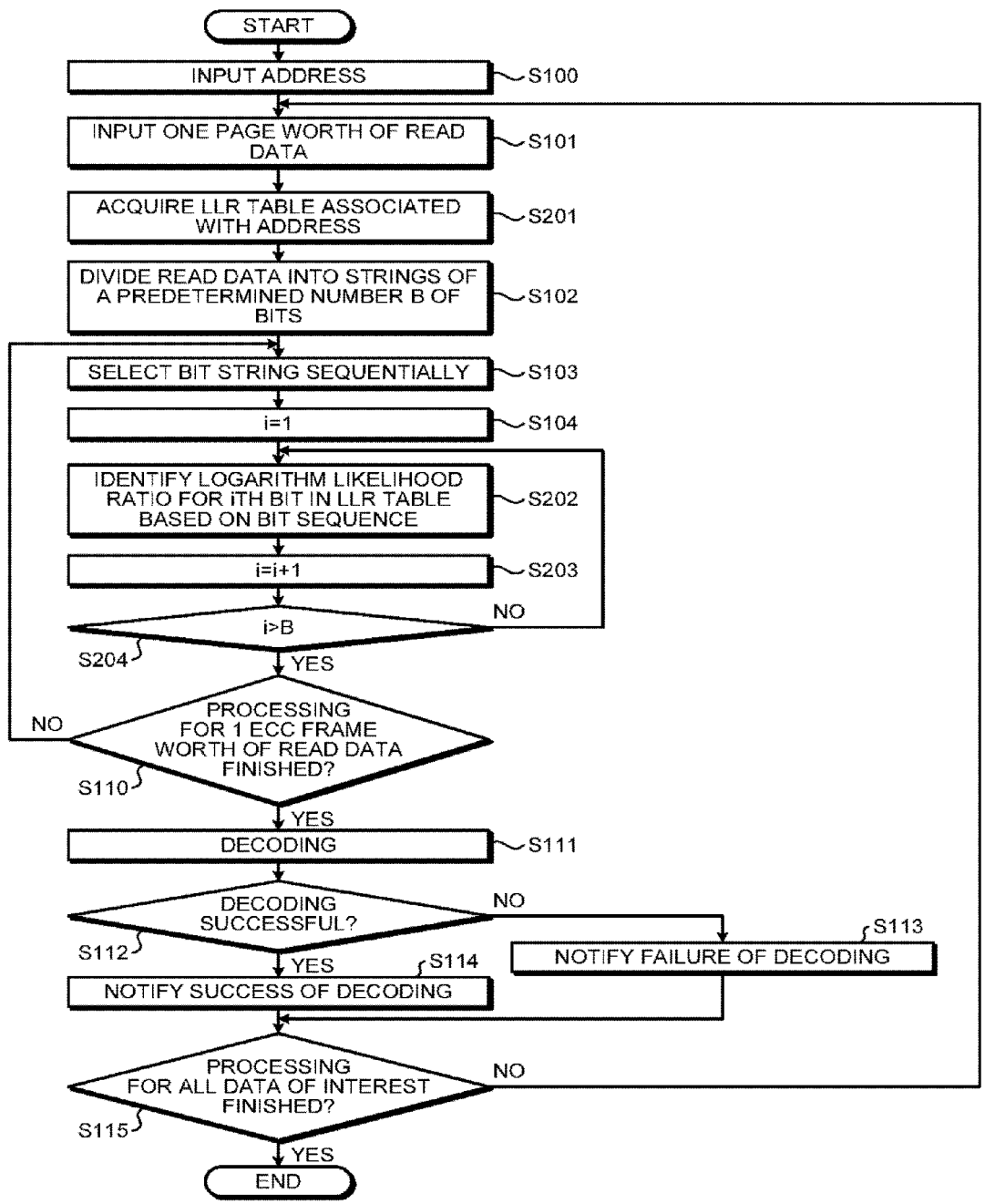
FIG. 6 is a flow chart showing a schematic example of the operation of a memory system according to the second embodiment.

Next, the operation of the memory system according to the second embodiment will be described in detail with reference to the drawings. FIG. 6 is a flow chart showing a schematic example of the operation of the memory system according to the second embodiment. In FIG. 6 and the description below, the operations of the components of the code processor 24 shown in FIGS. 1 and 2 are focused on. Further, in the description below, the same reference numerals are used to denote the same operations as in FIG. 3, and detailed description thereof is omitted.

The operation shown in FIG. 6 is performed, for example, when the controller 23 instructs the memory I/F 22 to read data from the non-volatile memory 3 (a read processing instruction) and also instructs the code processor 24 to decode read data, as is the operation described using FIG. 3 in the first embodiment.

As shown in FIG. 6, in this operation, first, an address 16 and one page worth of read data are inputted to the likelihood calculating circuit 104 (steps S100, S101), as in the operation of steps S100, S101 in FIG. 3. Then the likelihood calculating circuit 104 acquires the LLR table 210 associated with the inputted address 16 (step S201). Note that the LLR table 210 may be stored, for example, in a predetermined area of the non-volatile memory 3 or held in the data buffer 25.

Then the likelihood calculating circuit 104 divides one page worth of read data into bit strings each formed of a predetermined number B of bits and selects one of them and sets the value i of an up-counter to 1 (steps S102 to S104), as in the operation of steps S102 to S104 in FIG. 3.

Then the likelihood calculating circuit 104 identifies LLR data associated with a sequence formed of the ith read bit and the (i−1)'th and/or (i+1)'th read bit that are before and/or after, and adjacent to, this in the LLR table 210 (step S202).

Then the likelihood calculating circuit 104 increments the value i of the up-counter by 1 (step S203) and determines whether the value i after increment is greater than the predetermined number B (step S204). If the value i is less than or equal to the predetermined number B (NO at step S204), the likelihood calculating circuit 104 makes the process return to step S202 to repeat the operation of identifying LLR data for the ith read bit in the LLR table 210 so as to identify LLR data for the first to Bth read bits and to input the identified LLR data as LLR data 13 to the decoding circuit 105.

On the other hand, if the value i is greater than the predetermined number B (YES at step S204), the likelihood calculating circuit 104 performs the same operation as that of step S110 and later in FIG. 3.

As described above, in the second embodiment, the look-up table (LLR table) created beforehand in which likelihood values (LLR data) are associated with sequences (bit strings) of the values of adjacent read bits is used, and thus likelihood values to be associated with bit strings can be set finely. Therefore, it is possible to represent the likelihood for each bit more finely, so that the capability of correcting errors in the decoding circuit 105 can be improved.

Because the configuration, operation, and effects of the other parts are the same as those in the previously-described first embodiment, detailed description thereof is omitted from here.

Third Embodiment

Next, the memory system and control method according to the third embodiment will be described in detail below with reference to the drawings. In the description below, the same reference numerals are used to denote the same components and operations as in the above embodiments, and duplicate description thereof is omitted.

In the NAND cell type flash memory that can be adopted as the non-volatile memory 3, bits to be written into the memory may be replaced in order with each other in units of several bits so as to make the interface more efficient. Replacing, in order, bits to be written into the memory with each other in units of, e.g., several bits is referred to as interleaving in this description.

Figure 7:
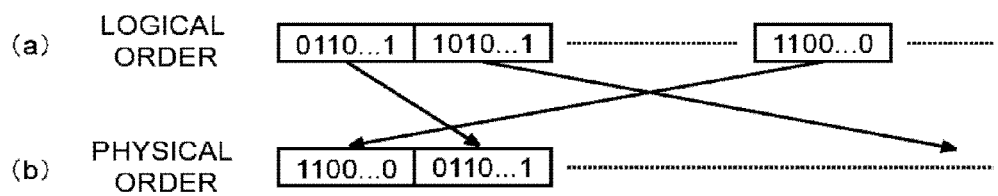
FIG. 7 is a schematic diagram showing an example of the sequence of data not interleaved and the sequence of data interleaved in a third embodiment.

FIG. 7 is a schematic diagram showing an example of the sequence of data not interleaved (FIG. 7 (a)) and the sequence of data interleaved and, e.g., actually written in the memory (FIG. 7 (b)). As shown in FIG. 7, in the NAND cell type flash memory for which interleaving is performed at write time, a sequence of data actually written in the memory (a physical order; see FIG. 7 (b)) does not hold the sequence of data not interleaved (a logical order; see FIG. 7 (a)), but its bits are replaced with each other in units of several bits (called replacement units). The replacement unit may be set to be of, e.g., one bit or eight bits as needed.

If data is written with being interleaved in this way, the influence between adjacent memory cells for some bits is not guaranteed. For example, when data is divided into bit strings in replacement units, as to bits located at boundaries (boundary bits), the values of their adjacent bits in opposite divisions may change between being interleaved and not being interleaved. Thus, for these bits, the improvement of accuracy of likelihood values by calculation using the aforementioned equation (2) may not be able to be expected. Accordingly, the third embodiment illustrates the following three methods that are ones which enable the improvement of accuracy of likelihood values even with interleaving.

(First Method)

In the first method, the sequence of data to be inputted to the likelihood calculating circuit 104 is made to be the same as the sequence (physical order) of data written in the non-volatile memory 3.

Figure 8:
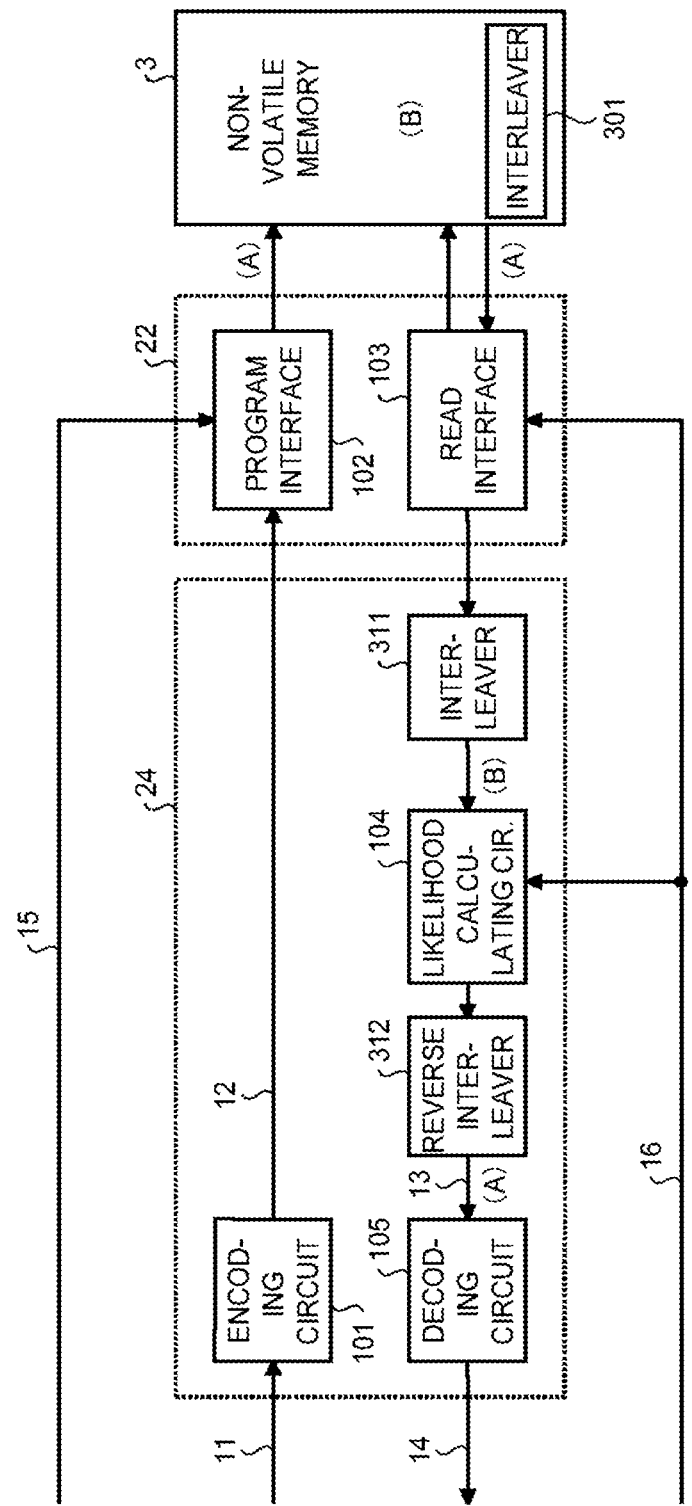
FIG. 8 is a diagram showing an example of a first configuration according to the third embodiment.
Figure 9:
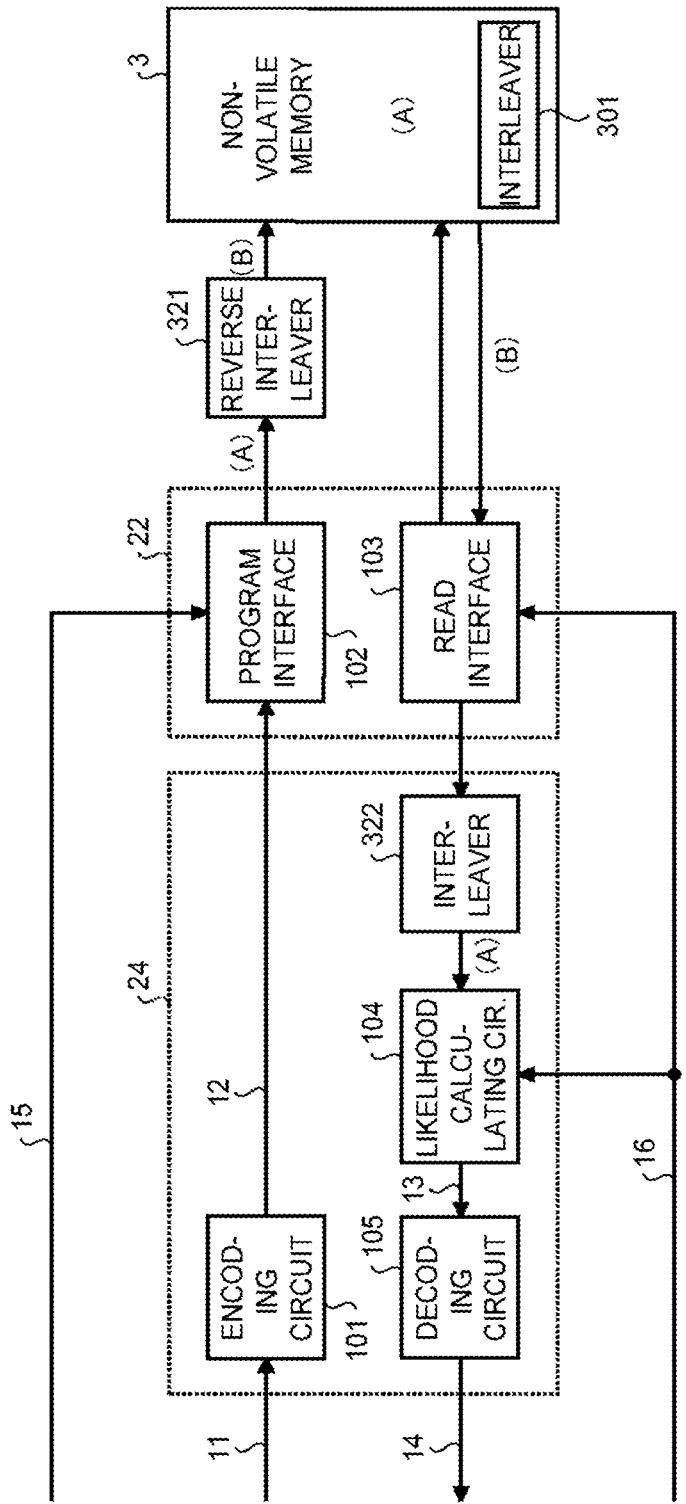
FIG. 9 is a diagram showing an example of a second configuration according to the third embodiment.

As examples of the configuration for making the order of data to be inputted to the likelihood calculating circuit 104 be the same as the sequence of data written in the non-volatile memory 3, there can be cited a first configuration where an interleaver is placed between the output of the non-volatile memory 3 and the input of the likelihood calculating circuit 104 and a second configuration where a reverse interleaver is placed between the output of the encoding circuit 101 and the input of the non-volatile memory 3 and where a reverse interleaver is placed between the output of the non-volatile memory 3 and the input of the likelihood calculating circuit 104. FIG. 8 shows an example of the first configuration, and FIG. 9 shows an example of the second configuration. In FIGS. 8 and 9, the sequence of data not interleaved is indicated by (A) while the sequence of data interleaved is indicated by (B). In the description below, reverse interleaving means making the sequence of data whose order is changed by interleaving return to the original non-interleaved sequence.

In the configuration illustrated in FIG. 8, an interleaver 311 is placed between the output of the non-volatile memory 3 and the input of the likelihood calculating circuit 104, specifically, between the output of the read interface 103 and the input of the likelihood calculating circuit 104.

ECC data 12 in the sequence (A) (hereinafter simply called data) outputted from the encoding circuit 101 is inputted to the non-volatile memory 3 via the program interface 102 with the sequence (A) being kept. In the non-volatile memory 3, an interleaver 301 integrated in the non-volatile memory 3 converts the sequence of the data from (A) to (B). Thus, the sequence of data written in the non-volatile memory 3 takes on (B).

At read time, read data is reversely interleaved by the interleaver 301 in the non-volatile memory 3. Thus, the sequence of data outputted from the non-volatile memory 3 takes on (A). The reversely-interleaved read data in the sequence (A) is inputted to the interleaver 311 via the read interface 103. Then the interleaver 311 interleaves the inputted data so as to convert the sequence from (A) to (B). Therefore, the sequence of data to be inputted to the likelihood calculating circuit 104 is the same sequence (B) as that of the data written in the non-volatile memory 3.

As such, the sequence of data to be inputted to the likelihood calculating circuit 104 is made to be the same as the sequence (physical order) of data written in the non-volatile memory 3, so that the likelihood calculating circuit 104 can take into account the influence of adjacent memory cells. Thus, it is possible to improve the accuracy of likelihood values by, e.g., calculation illustrated in the above embodiments.

In the configuration shown in FIG. 8, LLR data 13 to be inputted to the decoding circuit 105 needs to be in the not-interleaved sequence. Accordingly, in FIG. 8, a reverse interleaver 312 that performs reverse interleaving to convert LLR data in the sequence (B) into LLR data in the sequence (A) is provided between the output of the likelihood calculating circuit 104 and the input of the decoding circuit 105.

Meanwhile, in the configuration illustrated in FIG. 9, a reverse interleaver 321 is placed between the output of the encoding circuit 101 and the input of the non-volatile memory 3, specifically, between the output of the program interface 102 in the memory I/F 22 and the input of the non-volatile memory 3, and an interleaver 322 is placed between the output of the non-volatile memory 3 and the input of the likelihood calculating circuit 104, specifically, between the output of the read interface 103 and the input of the likelihood calculating circuit 104.

Data in the sequence (A) outputted from the encoding circuit 101 is converted in sequence from (A) to (B) by the reverse interleaver 321 before written into the non-volatile memory 3 by the program interface 102. In the non-volatile memory 3, the interleaver 301 integrated in the non-volatile memory 3 makes the sequence of the data return from (B) to (A). Thus, the sequence of the data written in the non-volatile memory 3 takes on (A).

At read time, because it is reversely interleaved by the interleaver 301 in the non-volatile memory 3, the sequence of data outputted from the non-volatile memory 3 takes on (B). The read data in the sequence (B) is inputted to the interleaver 322 via the read interface 103. Then the interleaver 322 reversely interleaves the inputted data so as to convert the sequence from (B) to (A). Therefore, the sequence of data to be inputted to the likelihood calculating circuit 104 is the same sequence (A) as that of the data written in the non-volatile memory 3.

Also with the configuration of FIG. 9, the sequence of data to be inputted to the likelihood calculating circuit 104 can be made to be the same as the sequence (physical order) of data written in the non-volatile memory 3, so that the likelihood calculating circuit 104 can take into account the influence of adjacent memory cells. Thus, it is possible to improve the accuracy of likelihood values by, e.g., calculation illustrated in the above embodiments.

(Second Method)

In the second method, likelihood values are identified ignoring at least the influence of cells on the side on which the influence between adjacent memory cells is not guaranteed. Thus, with this method, for boundary cells, for example, the influence of all adjacent cells is ignored, or the influence of cells on the side on which the influence between adjacent memory cells is not guaranteed is ignored. For cells for which the influence between adjacent memory cells is guaranteed (e.g., cells other than boundary cells), likelihood values may be identified taking into account the influence between adjacent memory cells as in the above embodiment.

As an example of the method of identifying likelihood values ignoring the influence of all adjacent cells, there can be cited the calculating method using the aforementioned equation (1). As an example of the method of identifying likelihood values ignoring the influence of cells on the side on which the influence between adjacent memory cells is not guaranteed, there can be cited the aforementioned identifying method using the LLR table 210, described using FIG. 5. Any of these identifying methods can be realized using the operation shown in FIG. 3 or 6 by setting the number of bits contained in the replacement unit to the predetermined number B in the operation shown in FIG. 3 or 6.

(Third Method)

In the third method, likelihood values are calculated on a replacement-unit basis. Specifically, the logarithm likelihood ratio $L_{b,i}$ for the ith read bit of the bth replacement unit is calculated using the following equation (3), which takes into account all the read bits contained in the bth replacement unit. For simplicity of description, in the description below, the number of bits contained in the replacement unit is set to the predetermined number B. In the equation (3), $x_{b,i}$ denotes the ith write bit of the bth replacement unit, and $y_{b,1}$, $y_{b,2}$, ..., $y_{b,B}$ denote the 1st, 2nd, ..., Bth read bits of the bth replacement unit respectively.

$$L_{b,i} = \log \frac{p(x_{b,i} = 0 \mid y_{b,1}, y_{b,2}, \ldots, y_{b,B})}{p(x_{b,i} = 1 \mid y_{b,1}, y_{b,2}, \ldots, y_{b,B})} \quad (3)$$

With the third method using this equation (3), because likelihood values (LLR data 13) for the bits of the replacement unit can be calculated all together, there is also the merit that likelihood values can be calculated quickly.

As described above, according to the third embodiment, even if the sequence of data is changed by interleaving, highly accurate likelihood values can be generated, and thus the capability of correcting errors in the decoding circuit 105 can be improved.

Because the configuration, operation, and effects of the other parts are the same as those in the previously-described first or second embodiment, detailed description thereof is omitted from here.

Fourth Embodiment

Next, the memory system and control method according to the fourth embodiment will be described in detail below with reference to the drawings. In the description below, the same reference numerals are used to denote the same components and operations as in the above embodiments, and duplicate description thereof is omitted.

Although the above embodiments illustrate the case where one-time reading is performed for one cell (hereinafter referred to as hard bit reading), the invention is not limited to this. For example, also where multiple times of reading is performed while changing the read threshold voltage level for one cell (hereinafter referred to as soft bit reading), likelihood values can be identified taking into account the influence between adjacent memory cells.

Where the likelihood calculating circuit 104 calculates likelihood values (LLR data 13), in calculation of LLR data 13, for example, the values of x and y in the aforementioned equation (2) are not binary data 0 or 1 (hereinafter called a hard bit) but should be a multi-value denoted by data (hereinafter called a soft bit) formed of multiple bits obtained through multiple times of reading.

Figures 10, 11:
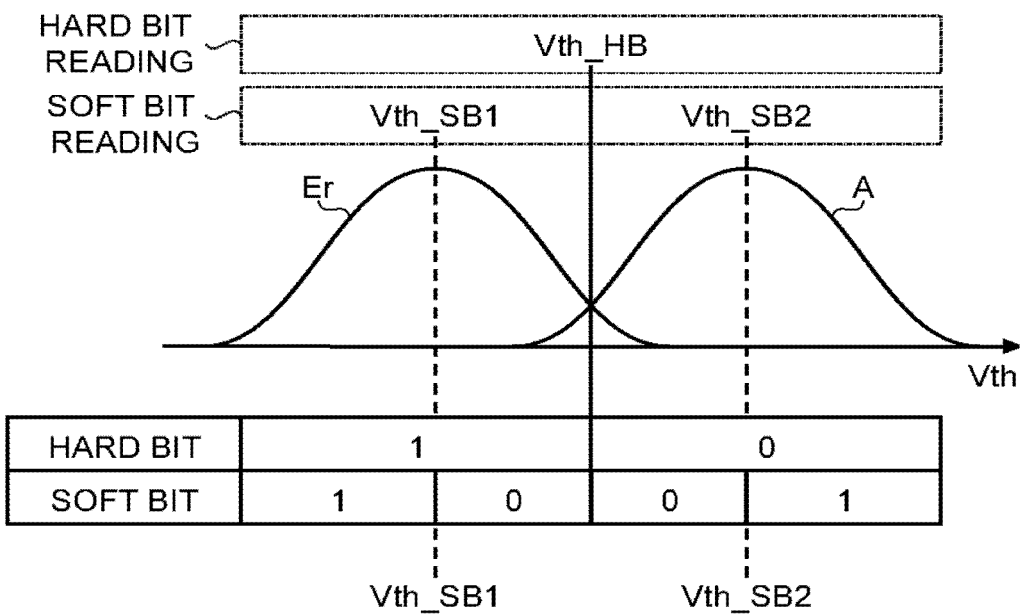
FIG. 10 shows an example of an LLR table according to a fourth embodiment.
FIG. 11 is a diagram for explaining hard bit reading operation and soft bit reading operation according to the fourth embodiment.

And where the likelihood calculating circuit 104 identifies likelihood values (LLR data 13) using the LLR table, the LLR table used by the likelihood calculating circuit 104 takes on a data structure illustrated in FIG. 10. As shown in FIG. 10, the LLR table for performing soft bit reading has a structure where a likelihood value (LLR data 13) are associated with a sequence (combination) of multiple hard bits obtained through hard bit reading from a cell of interest (the ith cell) and cells adjacent to this cell (the (i−1)'th and (i+1)'th cells) and multiple soft bits obtained through soft bit reading from the cell of interest (the ith cell) and cells adjacent to this cell (the (i−1)'th and (i+1)'th cells).

Here, the read threshold voltage level used in hard bit reading (hereinafter called an HB read threshold voltage level) and a hard bit obtained through hard bit reading, and the read threshold voltage level used in soft bit reading (hereinafter called an SB read threshold voltage level) and a soft bit obtained through soft bit reading will be described using FIG. 11. Although in FIG. 11, for simplicity of description, the case where memory cells are SLCs is illustrated, the invention can be applied to MLCs, TLCs, etc., likewise.

As shown in FIG. 11, when bits are written into memory cells in an SLC mode, the threshold voltage distribution of memory cells includes a threshold voltage distribution having a relatively low distribution area (called an Er distribution) and a threshold voltage distribution having a relatively high distribution area (called an A distribution). The Er distribution and A distribution are, for example, Gaussian distributions. The Er distribution corresponds to a bit value, e.g., 1, and the A distribution corresponds to a bit value, e.g., 0.

The HB read threshold voltage level Vth_HB for reading 1 and 0 from the two distributions at a low bit error rate is set to, e.g., the threshold voltage corresponding to the lowest bottom of the valley formed by the feet of the two distributions overlapping.

In the hard bit reading, the data value stored in a memory cell of interest is determined by detecting whether electrical charge flows via the memory cell with the HB read threshold voltage level Vth_HB being applied to the word line (selected word line) connected to the memory cell to read from, using a sense amplifier (not shown) in the non-volatile memory 3.

In this description, the operation of reading using one read threshold voltage level, as in the hard bit reading where the memory cell is an SLC, is referred to as single level read. In the hard bit reading illustrated in FIG. 11, a hard bit formed of one bit is acquired. Meanwhile, where the memory cell is a multivalued memory cell such as an MLC or TLC, multiple HB read threshold voltage levels are set for multiple threshold voltage distributions corresponding to the respective values, and a hard bit formed of multiple bits is finally acquired through the hard bit reading using these HB read threshold voltage levels.

Meanwhile, one or more SB read threshold voltage levels for acquiring soft bits are set to be on the high threshold voltage side and/or the low threshold voltage side with respect to the HB read threshold voltage level Vth_HB. In the example shown in FIG. 11, a low-side SB read threshold voltage level Vth_SB1 and a high-side SB read threshold voltage level Vth_SB2 are set at values of a predetermined resolution width ΔR with respect to the HB read threshold voltage Vth_HB.

In the soft bit reading, in addition to the above hard bit reading, the single level read using the low-side SB read threshold voltage level Vth_SB1 and the single level read using the high-side SB read threshold voltage level Vth_SB2 are sequentially performed. By performing a logical operation of OR or AND on bit values obtained through this, a soft bit formed of one bit is obtained in addition to a hard bit in the example shown in FIG. 11.

Where the memory cell is a multivalued memory cell such as an MLC or TLC, SB read threshold voltage levels are set for each of multiple HB read threshold voltage levels, and through the soft bit reading using each SB read threshold voltage level, a soft bit formed of multiple bits is finally obtained in addition to a hard bit.

Figure 12:
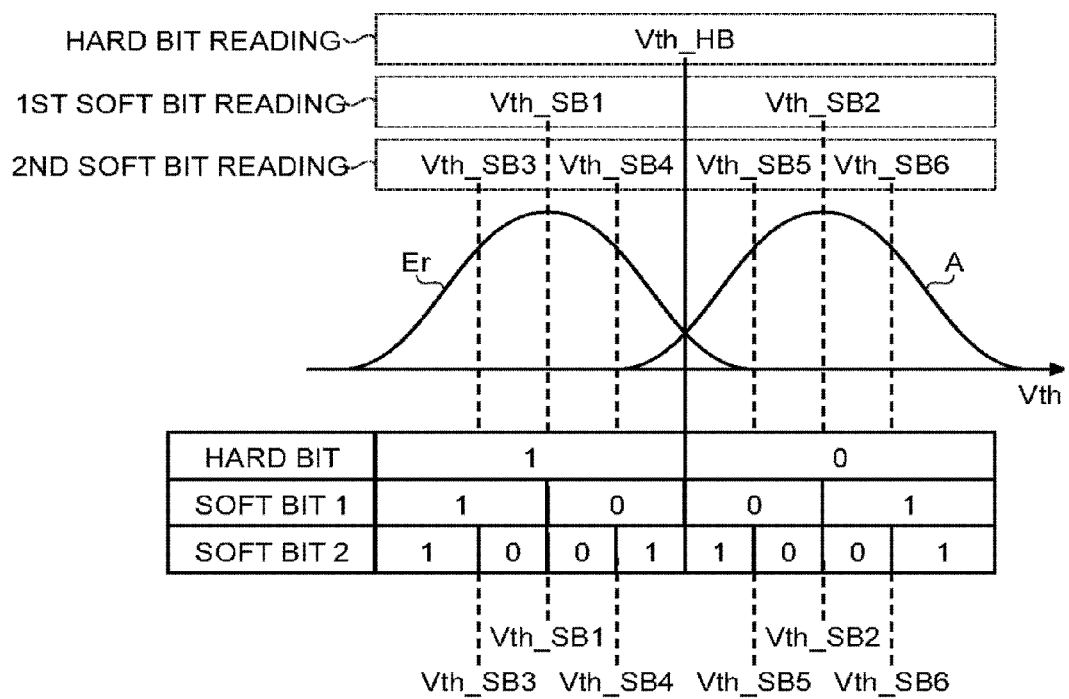
FIG. 12 is a diagram for explaining other hard bit reading operation and soft bit reading operation according to the fourth embodiment.

In the example shown in FIG. 11, the case where an SB read threshold voltage level is set for each of the high side and low side of the HB read threshold voltage level so as to obtain a soft bit is illustrated, but, not being limited to this configuration, a configuration where multiple (three in FIG. 12) SB read threshold voltage levels are set for each of the high side and low side of the HB read threshold voltage level so as to obtain soft bits is also possible as illustrated in, e.g., FIG. 12. In the example shown in FIG. 12, multiple SB read threshold voltage levels for acquiring soft bits are set to be on the high threshold voltage side and/or the low threshold voltage side with respect to the HB read threshold voltage level Vth_HB. In the example shown in FIG. 12, three SB read threshold voltage levels Vth_SB3, Vth_SB1, and Vth_SB4 with the predetermined resolution width ΔR are set to be on the low side with respect to the HB read threshold voltage Vth_HB, and three SB read threshold voltage levels Vth_SB5, Vth_SB2, and Vth_SB6 with the predetermined resolution width ΔR are set to be on the high side.

In the soft bit reading, in addition to the above hard bit reading, two times of soft bit reading is performed. In the first soft bit reading, the single level read using the low-side SB read threshold voltage level Vth_SB1 and the single level read using the high-side SB read threshold voltage level Vth_SB2 are sequentially performed, as in the soft bit reading shown in, e.g., FIG. 11, and by performing a logical operation of OR or AND on bit values obtained through this, a soft bit formed of one bit (soft bit 1) is obtained.

In the second soft bit reading, the single level reads using the remaining SB read threshold voltage levels Vth_SB3 to Vth_SB6 are sequentially performed, and by performing a logical operation of OR or AND on bit values obtained through this, a soft bit formed of one bit (soft bit 2) is obtained.

Because the decoding process using this soft bit reading needs multiple times of reading and the processing of multiple pages worth of data including hard bits, the processing cost may become high. Accordingly, the system may be configured such that, first, the decoding process using the hard bit reading is performed and that, if the decoding process is not successful, the decoding process using the soft bit reading is performed.

FIG. 13 is a flow chart showing a schematic example of the operation of the memory system at read time according to the fourth embodiment and is one showing a schematic example of the operation where, if the decoding using the hard bit reading is not successful, the decoding using the soft bit reading is performed.

As shown in FIG. 13, in this operation, first the controller 23 waits for a read request to be received from the host 4 via the host I/F 21 (NO at step S400). When receiving a read request from the host 4 (YES at step S400), the read interface 103 of the memory I/F 22 acquires hard bits from the non-volatile memory 3 through the hard bit reading according to an instruction from the controller 23 (step S401). At this time, the address 16 of data to be read is inputted from the controller 23 to the read interface 103.

The hard bits read by the read interface 103 are inputted to the likelihood calculating circuit 104 of the code processor 24. The address 16 of data to be read is also inputted from the controller 23 to the likelihood calculating circuit 104. The likelihood calculating circuit 104 generates LLR data 13 for each bit of the hard bits (called first LLR data) (step S402). The operation of generating the first LLR data may be the same as, for example, the one described previously with reference to steps S100 to S111 of FIG. 3 or the one described with reference to steps S100 to S111 of FIG. 6.

The first LLR data generated in this way is inputted to the decoding circuit 105. The decoding circuit 105 performs first decoding to perform error correction processing according to the soft determination decoding algorithm on the inputted first LLR data on an ECC frame basis so as to reconstruct user data 14 that is subject to reading (step S403). The result of the first decoding is temporarily stored in, e.g., the data buffer 25.

Then the decoding circuit 105 determines whether the first decoding at step S403 was successful (step S404) and, if the first decoding was successful (YES at step S404), notifies the controller 23 that the first decoding was successful. In response to this, the controller 23 transmits user data 14 stored in, e.g., the data buffer 25 to the host 4 via the host I/F 21 (step S410) and finishes the present operation. On the other hand, if the first decoding at step S403 failed (NO at step S404), the decoding circuit 105 notifies the controller 23 that the decoding failed.

When being notified that the first decoding failed, the controller 23 instructs the read interface 103 to perform the soft bit reading. In response to this, the read interface 103 acquires hard bits and soft bits from the non-volatile memory 3 through the soft bit reading according to the instruction from the controller 23 (step S405). Where the hard bits acquired at step S401 are held in a cache or the like (not shown), the hard bit reading in the soft bit reading can be omitted.

The hard bits and soft bits read by the read interface 103 are inputted to the likelihood calculating circuit 104 of the code processor 24. The likelihood calculating circuit 104 generates LLR data 13 (called second LLR data) using the hard bits and soft bits (step S406). The operation of generating the second LLR data can be realized by, for example, one which uses multi-values denoted by soft bits as the values of x and y in the equations (1) and (2) in the operation described previously with reference to steps S100 to S111 of FIG. 3 or one which uses the LLR table illustrated in FIG. 10 as the LLR table in the operation described with reference to steps S100 to S111 of FIG. 6.

The second LLR data generated in this way is inputted to the decoding circuit 105. The decoding circuit 105 performs second decoding to perform error correction processing according to the soft determination decoding algorithm on the inputted second LLR data on an ECC frame basis so as to reconstruct user data that is subject to reading (step S407). The result of the second decoding is temporarily stored in, e.g., the data buffer 25.

Then the decoding circuit 105 determines whether the second decoding at step S407 was successful (step S408) and, if the second decoding was successful (YES at step S408), notifies the controller 23 that the second decoding was successful. In response to this, the controller 23 transmits user data 14 stored in, e.g., the data buffer 25 to the host 4 via the host I/F 21 (step S410) and finishes the present operation. On the other hand, if the second decoding failed (NO at step S408), the decoding circuit 105 notifies the controller 23 that the second decoding failed. In response to this, the controller 23 performs error processing to notify the host 4 via the host I/F 21 that it failed to read data of interest (step S409) and ends the present operation.

As described above, also for multi-values obtained through the soft bit reading, likelihood values can be calculated taking into account the influence between adjacent memory cells. Thus, likelihood values (herein logarithm likelihood ratios) to be inputted to the decoding circuit 105 can be more highly accurately generated, so that decoding errors can be further reduced in number. As a result, the reliability of the memory system in reading can be further improved.

Because the configuration, operation, and effects of the other parts are the same as those in one of the above-described first to third embodiments, detailed description thereof is omitted from here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory that has a word line and a plurality of memory cells, which are electrically connected to the word line, respectively, the plurality of memory cells corresponding to a plurality of pages;
a memory interface that performs writing/reading data into/from the non-volatile memory by a page unit; and
a code processor that performs encoding data to be written into the non-volatile memory and decoding data read from the non-volatile memory, wherein
the memory interface writes a code word generated through encoding by the code processor into the non-volatile memory and reads the code word from the non-volatile memory as a first page data to input to the code processor, and $$L_i = \log \frac{p(x_i = 0 \mid y_{i-1}, y_i, y_{i+1})}{p(x_i = 1 \mid y_{i-1}, y_i, y_{i+1})}$$

the code processor generates a first likelihood value based on a first read bit, a second read bit and a third read bit and decodes the code word using the generated first likelihood value, the first likelihood value corresponding to the first read bit, the first page data including the first, second, and third read bits, the first page data corresponding to a first page among the plurality of pages read from the non-volatile memory by the memory interface, the first read bit corresponding to a first memory cell in the plurality of memory cells, the second read bit corresponding to a second memory cell in the plurality of memory cells, the second memory cell being adjacent to the first memory cell, the third read bit corresponding to a third memory cell in the plurality of memory cells, the third memory cell being adjacent to the first memory cell and differing from the second memory cell.

2. The memory system according to claim 1, wherein the code processor holds a look-up table where sequences of the values of multiple read bits are associated with likelihood values and refers to the look-up table to identify the first likelihood value using the value of the first read bit and the value of the second read bit and the value of the third read bit.

3. The memory system according to claim 2, wherein the code processor holds the look-up table different for each page.

4. The memory system according to claim 2, wherein the code processor holds the look-up table different for each read bit.

5. The memory system according to claim 1, wherein the non-volatile memory comprises a first interleaver that changes the sequence of inputted data with a predetermined number of bits as a replacement unit, and
wherein the code processor generates first likelihood values for the predetermined number of read bits contained in the replacement unit all together.

6. The memory system according to claim 5, wherein the code processor calculates a logarithm likelihood ratio $L_{b,i}$ for an ith read bit in a bth replacement unit using the following equation (2):

$$L_{b,i} = \log \frac{p(x_{b,i} = 0 \mid y_{b,1}, y_{b,2}, \ldots, y_{b,B})}{p(x_{b,i} = 1 \mid y_{b,1}, y_{b,2}, \ldots, y_{b,B})} \quad (2)$$

where B is the predetermined number, $x_{b,i}$ is an ith write bit in the bth replacement unit, and $y_{b,1}, y_{b,2}, \ldots, y_{b,B}$ are 1st, 2nd, ..., Bth read bits in the bth replacement unit, respectively.

7. The memory system according to claim 1, wherein the non-volatile memory comprises a first interleaver that changes the sequence of inputted data with a predetermined number of bits as a replacement unit, and
wherein the memory system further comprises a second interleaver that changes the sequence of the read bits in the first page data to be inputted to the code processor to the same bit sequence as the bit sequence changed to by the first interleaver of the non-volatile memory.

8. The memory system according to claim 1, wherein the memory interface performs hard bit reading to read the first page data from the non-volatile memory using a first read voltage level and inputs the read first page data read through the hard bit reading to the code processor.

9. The memory system according to claim 8, wherein the hard bit reading is reading the first page data based on a comparison result of a read voltage level applied to the word line in the reading of the code word from the non-volatile memory with a threshold voltage level held by each memory cell.

10. The memory system according to claim 9, wherein the value of each of the first to third read bits is 0 or 1.

11. The memory system according to claim 1, wherein the memory interface performs hard bit reading to read a code word from the non-volatile memory as the first page data using a first read voltage level and soft bit reading to read the code word from the non-volatile memory as a second page data using multiple second read voltage levels different from each other set with respect to the first read voltage level, and inputs the first page data and the second page data to the code processor, and
wherein the code processor generates a second likelihood value based on the first to third read bits and fourth to sixth read bits and decodes the code word using the generated second likelihood value, the second likelihood value corresponding to the first and fourth read bits, the second page data including the fourth to sixth read bits, the second page data corresponding to a second page among the plurality of pages read from the non-volatile memory by the memory interface, the fourth read bit corresponding to the first memory cell, the fifth read bit corresponding to the second memory cell, and the sixth read hit corresponding to the third memory cell.

12. The memory system according to claim 11, further comprising a controller that instructs the memory interface to write/read data into/from the non-volatile memory and instructs the code processor to encode data to be written into the non-volatile memory and decode data read from the non-volatile memory,
wherein if the code processor failed in decoding the code word using the first likelihood value, the controller instructs the memory interface to perform the soft bit reading and also instructs the code processor to generate the second likelihood value using the first page data and the second page data and to decode the code word using the second likelihood value.

13. The memory system according to claim 1, wherein the code processor calculates the first likelihood value $L_i$ using the following equation (1):

$$L_i = \log \frac{p(x_i = 0 \mid y_{i-1}, y_i, y_{i+1})}{p(x_i = 1 \mid y_{i-1}, y_i, y_{i+1})} \quad (1)$$

wherein $x_i$ is the value of a write bit written in the first memory cell, $y_i$ is the value of the first read bit, $y_{i-1}$ is the value of the second read bit, and $y_{i+1}$ is the value of the third read bit.

14. The memory system according to claim 13, wherein when the first page data inputted into the code processor does not include at least one of the second read bit and the third read bit, the code processor venerates the first likelihood ratio based on the first read bit without the second and third read bits $$L_i = \log \frac{p(x_i = 0 \mid y_i)}{p(x_i = 1 \mid y_i)}.$$

15. A method of controlling a non-volatile memory which has a word line and a plurality of memory cells, the plurality of memory cells being electrically connected to the word line, the plurality of memory cells corresponding to a plurality of pages, each one of the plurality of pages being a data reading unit, the method comprising:
encoding data;
writing a code word that is encoded data into the non-volatile memory;
reading the code word from the non-volatile memory as a first page data, the first page data corresponding to one of the plurality of pages;

$$L_i = \log \frac{p(x_i = 0 \mid y_{i-1}, y_i, y_{i+1})}{p(x_i = 1 \mid y_{i-1}, y_i, y_{i+1})}$$

generating a first likelihood value based on the first read bit, a second read bit and third read bit, the first likelihood value corresponding to the first read bit, the first page data including the first to third read bits, the first page data corresponding to a first page among the plurality of pages read from the non-volatile memory, the first read bit corresponding to a first memory cell in the plurality of memory cells, the second read bit corresponding to a second memory cell in the plurality of memory cells, the second memory cell being adjacent to the first memory cell, the third read bit corresponding to a third memo cell, the third memory cell being adjacent to the first memory cell and differing from the second memory cell; and decoding the read code word using the generated first likelihood value.

16. The method according to claim 15, further comprising calculating the following equation (1):

$$L_i = \log \frac{p(x_i = 0 \mid y_{i-1}, y_i, y_{i+1})}{p(x_i = 1 \mid y_{i-1}, y_i, y_{i+1})}, \quad (1)$$

wherein the first likelihood value $L_i$ is generated by the calculating, and wherein $x_i$ is the value of a write bit written in the first memory cell, $y_i$ is the value the first read bit, $y_{i-1}$ is the value of the second read bit, and $y_{i+1}$ is the value of the third read bit.

17. The method according to claim 16, wherein when the first page data does not include at least one of the second read bit and the third read bit, the first likelihood ratio is generated based on the first read bit without the second and third read bits.

18. The method according to claim 15, wherein the reading of the code word from the non-volatile memory as the first page data is hard bit reading in which a first read voltage level is used for reading the code word from the non-volatile memory.

19. The method according to claim 18, wherein the hard bit reading is reading the first page data based on a comparison result of a read voltage level applied to the word line in the reading of the code word from the non-volatile memory with a threshold voltage level held by each memory cell.

20. The method according to claim 19, wherein the value of each of the first to third read bits is 0 or 1.

* * * * *